(12) United States Patent
Garg et al.

(10) Patent No.: US 7,613,981 B2
(45) Date of Patent: Nov. 3, 2009

(54) SYSTEM AND METHOD FOR REDUCING POWER CONSUMPTION IN A LOW-DENSITY PARITY-CHECK (LDPC) DECODER

(75) Inventors: Rahul Garg, Faridabad (IN); Amrit Singh, Ludhiana, IN (US)

(73) Assignee: Freescale Semiconductor, Inc., Austin, TX (US)

( * ) Notice: Subject to any disclaimer, the term of this patent is extended or adjusted under 35 U.S.C. 154(b) by 316 days.

(21) Appl. No.: 11/851,383

(22) Filed: Sep. 6, 2007

(65) Prior Publication Data
US 2008/0086671 A1 Apr. 10, 2008

(30) Foreign Application Priority Data
Oct. 6, 2006 (IN) .................. 2211/DEL/2006

(51) Int. Cl.
*H03M 13/00* (2006.01)
(52) U.S. Cl. .................. 714/760; 714/758; 714/759; 714/799; 375/287
(58) Field of Classification Search ......... 714/758–760, 714/799, 801; 375/287
See application file for complete search history.

(56) References Cited
U.S. PATENT DOCUMENTS

| | | | |
|---|---|---|---|
| 7,107,511 B2 | 9/2006 | Shen et al. | |
| 7,178,080 B2 | 2/2007 | Hocevar | |
| 7,237,171 B2 | 6/2007 | Richardson | |
| 7,263,651 B2 | 8/2007 | Xia et al. | |
| 7,415,079 B2 * | 8/2008 | Cameron et al. | 375/340 |
| 7,451,386 B2 * | 11/2008 | Shen et al. | 714/801 |
| 7,453,960 B1 * | 11/2008 | Wu et al. | 375/340 |
| 7,502,987 B2 * | 3/2009 | Kyung et al. | 714/781 |
| 7,571,375 B2 * | 8/2009 | Kim et al. | 714/786 |
| 2005/0262424 A1 | 11/2005 | Tran et al. | |
| 2007/0089024 A1 | 4/2007 | Yu | |
| 2008/0077843 A1 * | 3/2008 | Cho et al. | 714/801 |

OTHER PUBLICATIONS

R.Bresnan et al., Efficient LDPC Decoding, Irish signals and systems conference 2004, Belfast. Jun. 30-Jul. 2. 6 pages.

* cited by examiner

*Primary Examiner*—Esaw T Abraham
(74) *Attorney, Agent, or Firm*—Charles Bergere

(57) ABSTRACT

A system and method for reducing power consumption in a Low Density Parity-Check Code (LDPC) decoder includes a sleep mode checking module and a gating circuit. The sleep mode checking module checks whether a check node is in sleep mode. The check node is considered to be in sleep mode when the absolute value of the message going to each of the one or more bit nodes corresponding to the check node is greater than a threshold value. The gating circuit turns OFF a Check Node and Bit Node Update Unit (CNBNU) associated with the check node when the check node is in the sleep mode. Turning OFF a CNBNU stops the exchange of messages between the check node and its corresponding one or more bit nodes.

17 Claims, 4 Drawing Sheets

SYSTEM AND METHOD FOR REDUCING POWER CONSUMPTION IN A LOW-DENSITY PARITY-CHECK (LDPC) DECODER

BACKGROUND OF THE INVENTION

The present invention relates generally to communication systems, and more specifically, to a system and method for reducing power consumption in a Low Density Parity-Check (LDPC) Decoder.

For efficient data transmission in a communication system, data transmission rates should be as close as possible to a theoretical Shannon limit. The Shannon limit of a communication channel is defined as the maximum amount of error-free digital information that can be transmitted with a specified bandwidth in the presence of noise interference. Currently used error-correcting codes in communication systems, such as forward error-correcting (FEC) codes and cyclic redundancy codes (CRC), are used to provide data transmission rates that are close to the Shannon limit. FEC codes differ from CRC in that FEC codes are specially designed to enable the receiver to correct errors in each received message independently, rather than wait for a large number of messages to arrive before performing the error-correction. Therefore, FEC codes enable seamless data transmission. Currently, LDPC codes are being used for performing FEC.

Communication systems that utilize LDPC codes for FEC use an LDPC decoder to decode incoming bits. An LDPC decoder has multiple bit nodes and check nodes and receives an independent message bit at each bit node. The value of a message bit is checked against a check bit at a check node, and the correct value of the message bit is updated at the bit node. The correct value of the message bit is resolved in an iterative exchange of messages between the bit nodes and the check nodes. The updating procedure is a major factor in dynamic power consumption in an LDPC decoder. In other words, a reduction in dynamic power consumption is linearly related to the number of check nodes that need to be updated. In wireless standards such as WiMax/WiBro, 802.11n, DVB-S2 and 10 Gbase-T, power consumption during the decoding operation is a matter of concern.

LDPC decoders currently used in communication systems keep updating check nodes and bit nodes for each iteration of an exchange of a message, even if their corresponding message value has been resolved or matured to a reasonable extent. This results in unnecessary updating of stable check nodes and bit nodes, causing increased dynamic power consumption. Some communication systems using LDPC decoders propose a bit node gating scheme to reduce dynamic power consumption. In this scheme, a bit node is turned OFF if the value of the incoming message bit has been resolved or matured at the bit node. In trellis topology, it is difficult to design the clock-gating circuit for turning off multiple bit nodes because the process requires a significant number of memory blocks in the design. Moreover, turning OFF a stable bit node only eliminates the procedure of updating the bit node, but the bit node is still read and the Check Node update process is still carried out during forward-error correction, resulting in unnecessary power consumption. It would be advantageous to be able to reduce dynamic power consumption in an LDPC decoder.

BRIEF DESCRIPTION OF THE DRAWINGS

The following detailed description of the preferred embodiments of the present invention will be better understood when read in conjunction with the appended drawings. The present invention is illustrated by way of example and not limited by the accompanying figures, in which like references indicate similar elements.

DETAILED DESCRIPTION OF THE PRESENT INVENTION

Figure 1:
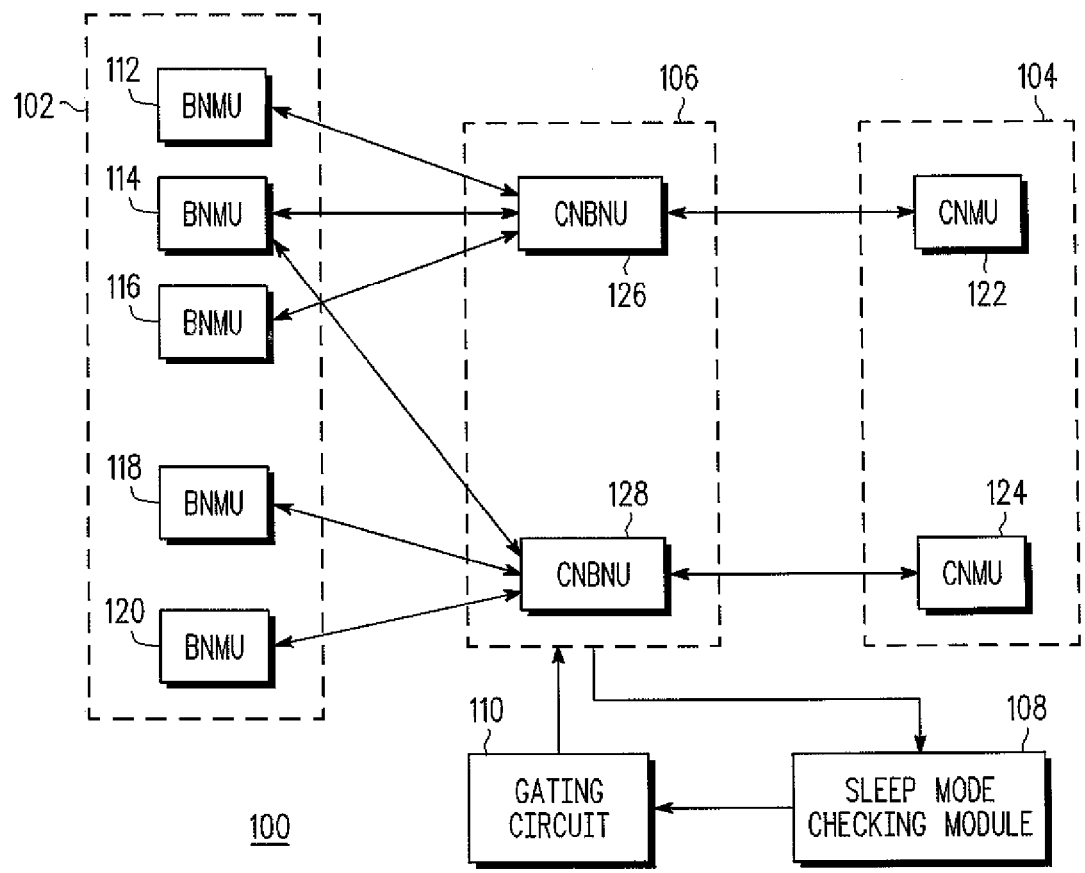
FIG. 1 is a schematic block diagram of an LDPC decoder, in accordance with the present invention.

The detailed description, in connection with the appended drawings, is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for reducing power consumption in a Low Density Parity-Check (LDPC) decoder is provided. The LDPC decoder includes a plurality of Bit Node Memory Units (BNMUs) corresponding to a plurality of bit nodes, a plurality of Check Node Memory Units (CNMUs) corresponding to a plurality of check nodes, and a plurality of Check Node and Bit Node Update Units (CNBNUs). Each of the plurality of BNMUs has at least one bit node that is used for storing a bit node message value corresponding to a check node. Each of the plurality of CNMUs has at least one check node that is used for storing a check node message value corresponding to one or more bit nodes. The one or more bit nodes of the plurality of bit nodes exchange messages with the check node to resolve the correct bit node message values of each of the one or more bit nodes. Each CNBNU is associated with a check node and is used to update the check node and one or more bit nodes corresponding to the check node in multiple iterations of exchange of messages between the check node and the one or more bit nodes. The system for reducing power consumption includes a sleep mode checking module and a gating circuit connected to the sleep mode checking module. The sleep mode checking module checks whether a check node is in sleep mode. The check node is considered to be in sleep mode when the absolute value of the message going to each of the one or more bit nodes corresponding to the check node is greater than a threshold value. Further, the gating circuit turns OFF a CNBNU that is associated with the check node. Turning OFF the CNBNU stops the exchange of messages between the check node and the corresponding one or more bit nodes.

In another embodiment of the present invention, a method for reducing power consumption in a LDPC decoder is provided. The LDPC decoder includes a plurality of Bit Node Memory Units (BNMUs) corresponding to a plurality of bit nodes, a plurality of Check Node Memory Units (CNMUs) corresponding to a plurality of check nodes, and a plurality of Check Node and Bit Node Update Units (CNBNUs). Each of the plurality of BNMUs has at least one bit node that is used to store a bit node message value corresponding to a check node. Each of the plurality of CNMUs has at least one check node that is used to store a check node message value corresponding to one or more bit nodes. The one or more bit nodes of the plurality of bit nodes exchange messages with the check node to resolve correct bit node message values of each of the one or more bit nodes. Each CNBNU is associated with a check node and is used to update a check node and one or more bit nodes corresponding to the check node in multiple iteration of exchange of messages between the check node and the one or more bit nodes. The method includes selecting a check node and then updating it. Updating the check node includes modifying the check node message value corresponding to the one or more bit nodes. It also involves modifying the bit node message values of each of the one or more bit nodes corresponding to the check node. The method also includes checking whether the check node is in sleep mode. A check node is considered to be in sleep mode if, after updating the check node, an absolute value of the message going to each of the one or more bit nodes corresponding to the check node is greater than a threshold value. Again, for further iterations, a CNBNU associated with a check node is turned OFF when the check node is in sleep mode. Turning OFF the CNBNU stops the exchange of messages between the check node and the corresponding one or more bit nodes.

In yet another embodiment of the present invention, an LDPC decoder is provided. The LDPC decoder includes a plurality of Bit Node Memory Units (BNMUs) corresponding to a plurality of bit nodes, a plurality of Check Node Memory Units (CNMUs) corresponding to a plurality of check nodes, a plurality of Check Node and Bit Node Update Units (CNBNUs), a sleep mode checking module and a gating circuit. Each BNMU from the plurality of BNMUs has at least one bit node that is used to store a bit node message value corresponding to a check node. Each of the plurality of CNMUs has at least one check node that is used to store a check node message value corresponding to one or more bit nodes. The one or more bit nodes of the plurality of bit nodes exchange messages with the check node to resolve correct bit node message values of each of the one or more bit nodes. Each CNBNU is associated with a check node and is used to update a check node and one or more bit nodes corresponding to the check node in multiple iterations of exchange of messages between the check node and the one or more bit nodes. The sleep mode checking module checks whether a check node is in sleep mode. The check node is considered to be in sleep mode when the absolute value of the message going to each of the one or more bit nodes corresponding to the check node is greater than a threshold value. The gating circuit is connected to the sleep mode checking module and turns OFF a CNBNU associated with the check node. Turning OFF the CNBNU stops an exchange of messages between the check node and the corresponding one or more bit nodes.

Embodiments of the present invention provide a system and method for reducing power consumption in an LDPC decoder. Typically, power consumption in the LDPC decoder depends on the number of check nodes that need to be updated. The present system reduces power consumption in the LDPC decoder by reducing the number of check nodes that need to be updated. The present invention provides a fixed threshold scheme and a variable threshold scheme to reduce power consumption. These schemes use a threshold value, which represents the probability of the occurrence of a logic value (0 or 1) at the bit nodes of the LDPC decoder. Using a high value for the threshold ensures better performance but increases the power consumption of the LDPC decoder. Therefore, the value of the threshold can be chosen to achieve a trade-off between power consumption and the performance of the LDPC decoder.

Referring now to FIG. 1, a schematic block diagram of a LDPC decoder 100, in accordance with an embodiment of the present invention, is shown. In an embodiment of the present invention, the LDPC decoder 100 is part of a receiver in a communication system. The LDPC decoder 100 includes a plurality of Bit Node Memory Units (BNMUs) 102, a plurality of Check Node Memory Units (CNMUs) 104, a plurality of Check Node and Bit Node Update Units (CNBNUs) 106, a sleep mode checking module 108, and a gating circuit 110. A typical LDPC decoder has a plurality of layers of BNMUs, CNMUs and CNBNUs. In an embodiment of the present invention, each layer of BNMU, CNMU and CNBNU operates in parallel to the other layers of the plurality of layers. The schematic block diagram of the LDPC decoder 100 shown in FIG. 1 is an architecture representing a single layer of the LDPC decoder. It will be apparent to a person skilled in the art that the architecture is scalable to a multilayered architecture. In other words, a similar architecture can be represented for each layer of a multilayered structure.

The plurality of BNMUs 102 includes a BNMU 112, a BNMU 114, a BNMU 116, a BNMU 118, and a BNMU 120. The plurality of CNMUs 104 includes a CNMU 122 and a CNMU 124. The plurality of CNBNUs 106 includes a CNBNU 126 and a CNBNU 128. The plurality of BNMUs 102, the plurality of CNMUs 104 and the plurality of CNBNUs 106, shown in FIG. 1, are for exemplary purposes only. It will be apparent to a person skilled in the art that the plurality of BNMUs 102, the plurality of CNMUs 104 and the plurality of CNBNUs 106 can include elements in addition to those shown in FIG. 1. The plurality of BNMUs 102 corresponds to a plurality of bit nodes. In an embodiment of the present invention, each of the BNMUs 112, 114, 116, 118 and 120 has at least one bit node. A bit node is a memory module and is used for storing a bit node message value. A bit node message value is the logical value of a message bit received by the receiver. The plurality of CNMUs 104 corresponds to a plurality of check nodes. In an embodiment of the present invention, each of the CNMUs 122 and 124 has at least one check node. A check node is a memory module and is used for storing a check node message value corresponding to one or more bit node message values stored at the one or more bit nodes. The plurality of CNBNUs 106 includes a CNBNU 126 and a CNBNU 128. The CNBNU 126 is used to update the check node at the CNMU 122 and the bit nodes at the BNMUs 112, 114 and 116. Similarly, the CNBNU 128 is used to update the check node at the CNMU 124 and the bit nodes at the BNMUs 118 and 120. Each of the CNBNUs 126 and 128 is associated with a check node from the plurality of check nodes. The CNBNU 126 is operatively coupled to the check node of the CNMU 122, and the CNBNU 128 is operatively coupled to the check node of the CNMU 124. The CNBNU 126 is responsible for updating the bit nodes in the BNMUs 112, 114 and 116. The CNBNU 126 is also used to update the check node at the CNMU 122.

There are many algorithms known in the art that are used for check node updating for layered LDPC decoding including, Sum-Product algorithm and MIN Sum algorithm.

Although, the check node update algorithm or the kernel operation is independent of the present invention, an example of MIN Sum is provided below. Let BA(i), BB(i) and BC(i) be the ith iteration incoming messages coming from three bit nodes stored in BNMUs 112, 114 and 116 respectively. Let CA(i−1), CB(i−1) and CC(i−1) be the (i−1)th iteration messages going to BNMUs 112, 114 and 116 respectively from CNBNU 126. Further let NBA(i), NBB(i) and NBC(i) be the ith iteration outgoing messages to the BNMUs 112, 114 and 116 respectively.

The following steps are performed.
A) Find A=BA(i)−CA(i−1)
B) Find B=BB(i)−CB(i−1)
C) Find C=BC(i)−CC(i−1)
D) New value of CA, i.e., CA(i)=B^C, where "^" operator is defined in step J. This new value of CA is stored in CNMU 122 as CA(i) to be used in the next iteration (i+1).
E) New value of CB, i.e., CB(i)=A^C, where "^" operator is defined in step J. This new value of CB is stored in CNMU 122 as CB(i) to be used in the next iteration (i+1).
F) New value of CC, i.e., CC(i)=A^B, where "^" operator is defined in step J. This new value of CC is stored in CNMU 122 as CC(i) to be used in the next iteration (i+1)
G) New value of outgoing message NBA(i)=A+CA(i). This new value of NBA(i) is stored in BNMU 112.
H) New value of outgoing message NBB(i)=B+CB(i). This new value of NBB(i) is stored in BNMU 114.
I) New value of outgoing message NBC(i)=C+CC(i). This new value of NBC(i) is stored in BNMU 116.
J) The operator "^" is evaluated as below:

$$A^\wedge B = \text{sign}(A) * \text{sign}(B) * \text{Min}(\text{abs}(A), \text{abs}(B)) + \text{Ln}(1 + \exp(-\text{abs}(A+B))) - \text{Ln}(1 + \exp(-\text{abs}(A-B)))$$

It should be noted that the new values NBA(i), NBB(i), and NCC(i) are the values that are compared to the threshold value to determine whether the Check Node is sleeping or not for further iterations ((i+1) onwards). Similarly, the bit nodes corresponding to the BNMUs 118 and 120 are operatively coupled to the CNBNU 128, and the CNBNU 128 is operatively coupled to the CNMU 124. The CNBNU 126 is responsible for updating the bit nodes at the BNMUs 118 and 120 and the check node at the CNMU 124. The plurality of BNMUs 102 in the receiver receives multiple message bits. Each bit node message value of a received message bit is stored at a bit node of a BNMU, for example, BNMU 112, in the plurality of BNMUs 102. The bit node message values of the received message bits might be corrupted due to noise in the communication system. In a communication system, all the message bits are supposed to follow a predetermined sequence or mathematical arrangement. For example, in an 8-bit block of data X0 X1 X2 X3 X4 X5 X6 X7, the bits Xi are arranged such that $X_i \oplus X_{i+2}=0$, where $i=0$ to 5 and $X_i \oplus X_{i-2}=0$, where $6 \geq i \leq 7$ The predetermined sequence or mathematical arrangement can be disturbed by noise, resulting in a different message value at a bit node from an expected message value. A bit node message value at a bit node of the BNMU 112 is checked against a check node message value stored at a check node of the CNMU 122, based on the predetermined sequence or mathematical arrangement. Each check node checks that one of the possible sequences or arrangements is being satisfied or not. For example, the CNBNU 126 associated with check node of CNMU 122 may perform modulo-2 addition of the signs of the Bit Nodes corresponding to BNMUs 112, 114 and 116 and if the result is not zero, it means that the parity check is not satisfied. In this case, messages are iteratively exchanged between Bit nodes and check node as already described above, until the parity check is satisfied. However, the innovation is that without checking for parity, it is not necessary to keep on updating a Check node and its associated bit nodes if all the outgoing messages to the bit nodes have an absolute value higher than a threshold. The other check nodes that are not sleeping can still work and update the bit nodes. In an embodiment of the present invention, the LDPC decoder 100 stops updating a check node and the corresponding one or more bit nodes once the correct bit node message value of each bit node is obtained or when an allotted time has been spent without obtaining the correct bit node message value. The exchange of messages is explained further in conjunction with the description of FIG. 4.

In a typical LDPC decoder, a CNBNU continues to update a check node even if the bit node message value of each of the one or more bit nodes corresponding to the check node has already matured to a certain level. After this has occurred, this particular check node does not need to be updated. Other check nodes that are not sleeping can update the value of the Bit nodes. To save unnecessary power consumption during the process of updating the check nodes and the one or more bit nodes corresponding to the check nodes, the present invention identifies the check nodes for which the bit node message values of the corresponding one or more bit nodes has matured. The sleep mode checking module 108 checks whether a check node is in sleep mode. The sleep mode of a check node represents a state of the check node in which the bit node message values of each of the one or more bit nodes corresponding to the check node are matured.

The sleep mode checking module 108 is operatively coupled to the plurality of CNBNUs 106. The sleep mode checking module 108 checks whether a check node of a CNBNU of the plurality of CNBNUs 106 is in sleep mode. A check node is considered to be in sleep mode when the absolute value of the bit node message values of each of the one or more bit nodes corresponding to the check node is greater than a threshold value. The sleep mode checking module 108 has one or more stored threshold values. In an embodiment of the present invention, the threshold value of the one or more threshold values is selected and compared with the absolute value of the bit node message values of the bit nodes at the BNMUs 112, 114 and 116. This comparison is performed to determine whether the check node at the CNMU 122 is in sleep mode. The selection of the threshold value is explained further in conjunction with FIG. 2.

In an embodiment of the present invention, the absolute value of the bit node message value is a symbol probability of a logic level (0 or 1) of the bit at the bit node. The symbol probability of the bit is the log-likelihood ratio (LLR) of the bit. The LLR represents a probability of a particular bit being at a particular logic level. In an embodiment of the present invention, this represents the probability of a bit being at a HIGH logic level. In this embodiment, a higher value of the LLR of a bit represents a higher probability of the bit being at a HIGH logic level. The gating circuit 110 turns off a CNBNU associated with the check node, which is in sleep mode. In an embodiment of the present invention, the sleep mode checking module 108 performs a sleep mode check operation for a check node after the expiry of a standby period. This eliminates the possibility of turning OFF the check node during the turbulent startup phase of message exchange between one or more bit nodes and the corresponding check node. The standby period is user programmable.

Figure 2:
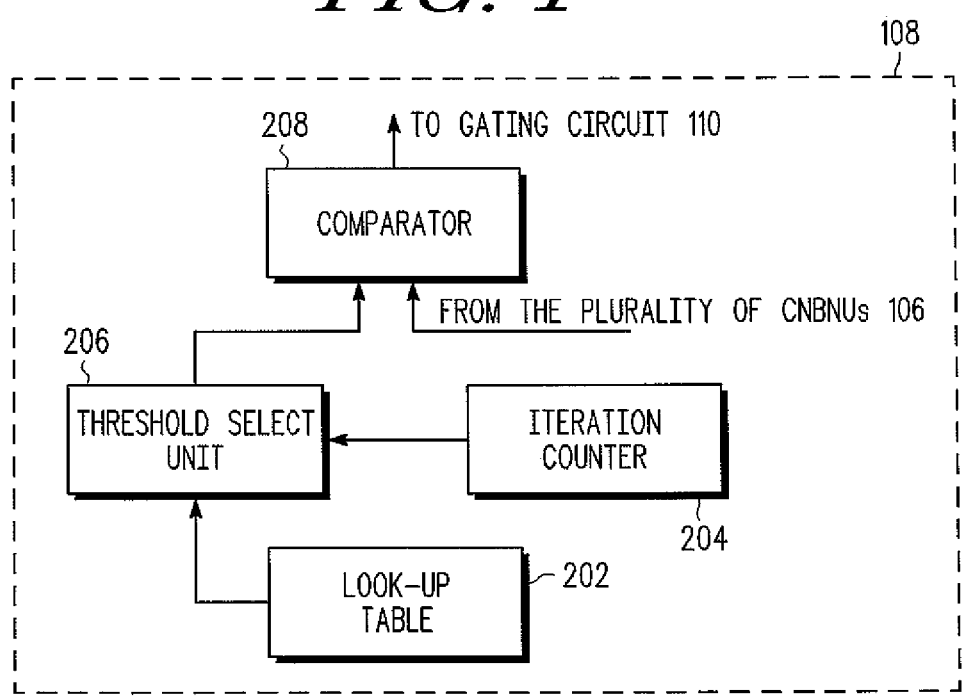
FIG. 2 is a schematic block diagram of a sleep mode checking module, in accordance with the present invention.

Referring now to FIG. 2, a block diagram of the sleep mode checking module 108 is shown. The sleep mode checking module 108 includes a look-up table (LUT) 202, an iteration counter 204, a threshold select unit 206 and a comparator 208. The LUT 202 stores one or more threshold values. In an embodiment of the present invention, the threshold value lies in the range of 0 to 1. The threshold value represents the symbol probability of a bit being at a particular logic level. The iteration counter 204 counts the number of iterations of an exchange of messages between a check node of a CNMU in the plurality of CNMUs 104 and the corresponding one or more bit nodes of one or more BNMUs in the plurality of BNMUs 102. The threshold select unit 206 is connected to the LUT 202. The threshold select unit 206 selects a threshold value from the one or more threshold values stored in the LUT 202. The selected threshold value is used to check whether a check node is in sleep mode. In an embodiment of the present invention, this check is performed at the same time as when the one or more bit nodes corresponding to the check node are updated by the respective bit node message values. The threshold select unit 206 selects a threshold value, based on the number of iterations of the exchange of messages between the check node and the corresponding one or more bit nodes. The selection of a threshold value, on the basis of the number of iterations of the exchange of messages, is based on the fact that if a bit is continuously moving towards a stable value in each iteration, a lower threshold value can be used for subsequent iterations. In an embodiment of the present invention, the threshold value selected for each iteration during the exchange of messages is of a lower value or equal to the previous iteration. In another embodiment of the present invention, the threshold value is fixed, i.e., the same threshold value is used for each subsequent iteration. The comparator 208 is connected to the threshold select unit 206. The comparator 208 receives a threshold value from the threshold select unit 206 and also receives the updated bit node message values from a CNBNU of the plurality of CNBNUs 106, to check the status of the check node associated with CNBNU. The comparator 208 compares the updated bit node message values with the threshold value and provides the status of the check node as an output to the gating circuit 110. The gating circuit 110 is explained further in conjunction with the description of FIG. 3.

Figure 3:
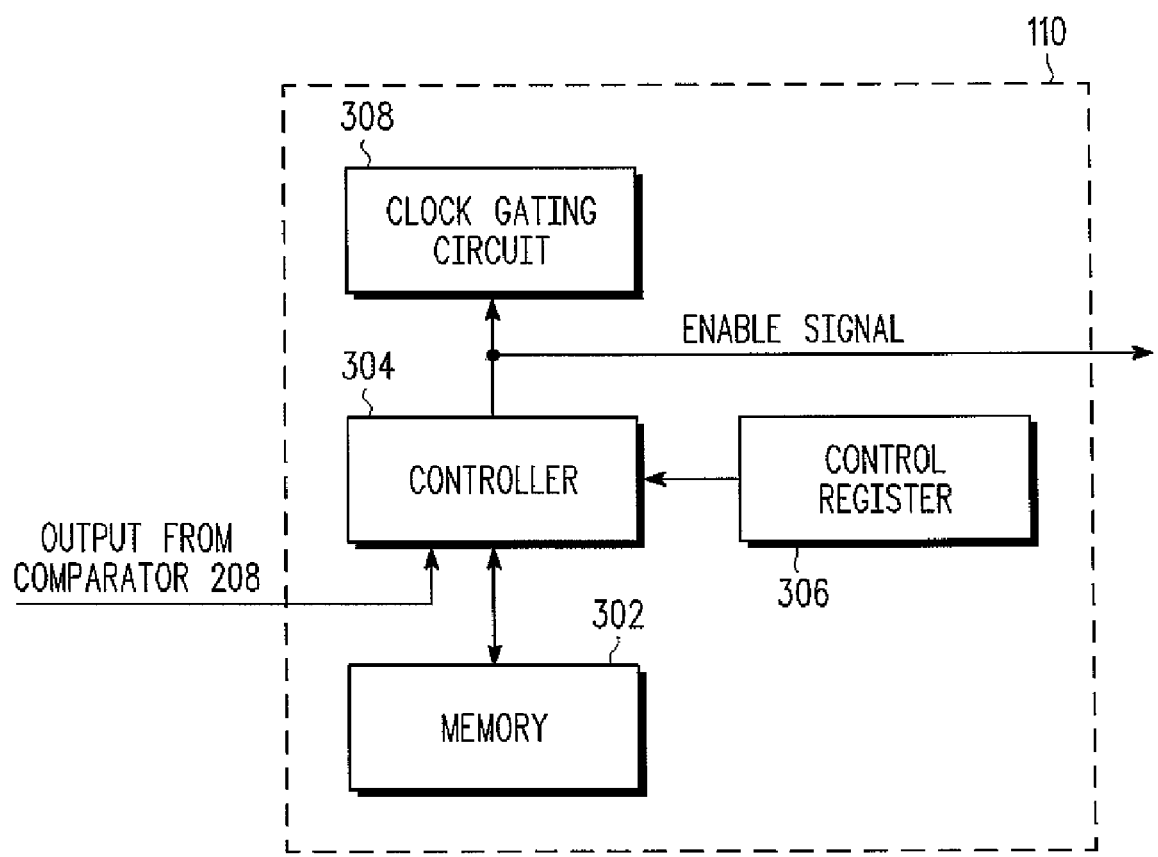
FIG. 3 is a schematic block diagram of a gating circuit, in accordance with the present invention.

Referring now to FIG. 3, a block diagram of one embodiment of the gating circuit 110 is shown. The gating circuit 110 includes a memory 302, a controller 304, a control register 306, and a clock gating circuit 308. The memory 302 stores the status of each check node of the plurality of check nodes after each iteration of the exchange of messages. The status includes information about whether a check node is in sleep mode. The controller 304 is connected to the memory 302 as well as to the clock gating circuit 308. The controller 304 provides the status of a check node to the memory, based on the input from the comparator 208. The controller 304 also generates an enable signal corresponding to the check node, based on the status of the check node. The control register 306 is connected to the controller 304 and stores information pertaining to the association of a check node with its corresponding bit nodes. This information includes identification of one or more bit nodes that are operatively coupled to each check node. The controller 304 provides the enable signal to the clock-gating circuit 308, which turns OFF a CNBNU associated with the check node, based on the enable signal. In an embodiment of the present invention, the enable signal is also used to turn OFF the accesses on relevant CNMUs and BNMUs.

Figure 4:
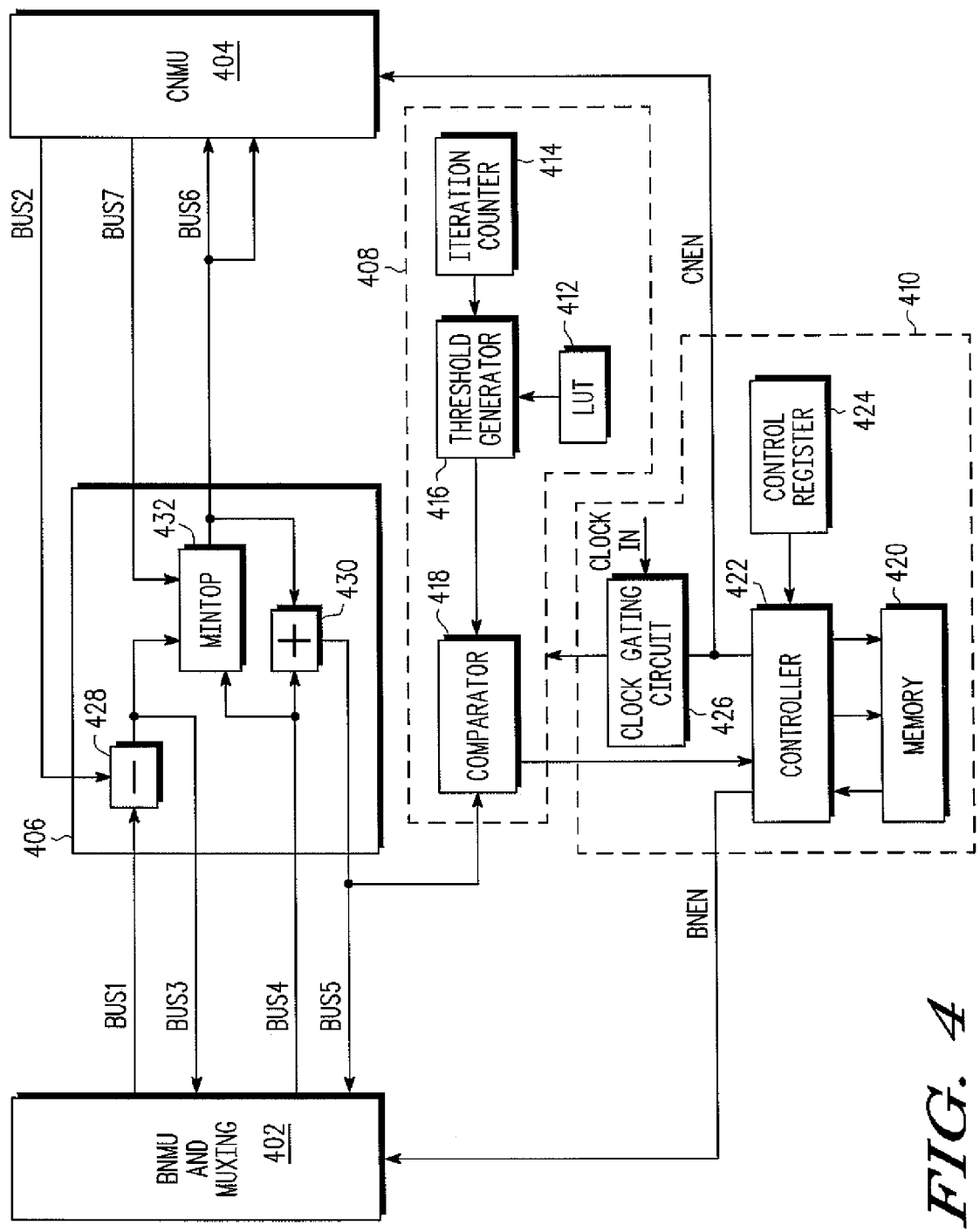
FIG. 4 is a schematic block diagram illustrating the procedure for turning OFF a CNBNU of an LDPC decoder by using a gating circuit, in accordance with the present invention.

Referring now to FIG. 4, a schematic block diagram, illustrating the procedure for turning OFF the CNBNU 126 of the LDPC decoder 100 by using the gating circuit 110 is shown. FIG. 4 shows a plurality of BNMUs 402, a CNMU 404, a CNBNU 406, a sleep mode checking module 408 and a gating circuit 410. The sleep mode checking module 408 includes an LUT 412, an iteration counter 414, a threshold generator 416, and a comparator 418. The gating circuit 410 includes a memory 420, a controller 422, a control register 424, and a clock gating circuit 426. The CNBNU 406 includes a subtractor 428, an adder 430, and a MINTOP circuit 432. The MIN TOP circuit is used to implement the Kernel operation described above. The MIN TOPO circuit receives as inputs messages from the bit nodes and generates output messages for them. FIG. 4 shows a plurality of buses for the exchange of messages between a check node at the CNMU 122 and the one or more bit nodes in the plurality of BNMUs 102. The buses are BUS1, BUS2, BUS3, BUS4, BUS5, and BUS6. The buses are used to read/write a bit node message value or a check node message to read the bit values of the plurality of BNMUs 402 and CNMU 404. The BUSES 3, 5, and 6 are used to write the bit values of the bit nodes at the plurality of BNMUs 402 and CNMU 404. It will be apparent to a person skilled in the art that FIG. 4 can include other read and write buses to exchange messages and update bit nodes and check nodes.

The bit node message value of each bit node of the one or more bit nodes at the plurality of BNMUs 402 is conveyed to the CNBNU 406 via BUS1. The CNBNU 406 receives its corresponding check node message value from the CNMU 404 via BUS2. The CNBNU 406 performs logical operations to solve a parity check equation for the check node using the subtractor 428, adder 430, and MINTOP circuit 432, which results in the generation of updated bit node message values for each bit node. The updated bit node message values are written in the plurality of BNMUs 402 via BUS5. The updated values are also sent to the comparator 418.

The comparator 418 receives a threshold value generated by the threshold generator 416, based on the number of iterations in the exchange of messages between the one or more bit nodes and the check node. Each updated bit node message value is compared with the threshold value. In an embodiment of the present invention, the comparator 418 provides an output signal of HIGH logic level when the updated bit node message values of each bit node of the one or more bit nodes are greater than the threshold value. This HIGH output signal is used by the controller 422 to keep track of the status of the check node. The controller 422 stores the status of each check node in the memory 420 according to the check node number. The control register 424 provides the information representing the identification of one or more bit nodes, which are operatively coupled to each check node. The control register 424 stores a parity matrix. The parity matrix represents the interconnections between each check node and its corresponding one or more bit nodes. The controller 422 also generates a check node to enable a signal (CNEN) for a check node, based on the status of the check node in the memory. Before the initiation of the processing of a check node, the controller 422 checks the status of the check node in the memory 420. In an embodiment of the present invention, the controller 422 clears the CNEN signal when the status of the check node is in the sleep mode. Thereafter, the clock-gating circuit 426 turns OFF the clock provided to the CNBNU 406 to stop the exchange of messages. In an embodiment of the present invention, the CNEN signal is also provided to the CNMU 404, and a Bit Node Enable (BNEN) signal is provided to the plurality of BNMUs 402. The BNEN signal stops the respective bit node memory units from performing read and write operations when the check node is in the sleep mode.

Figure 5:
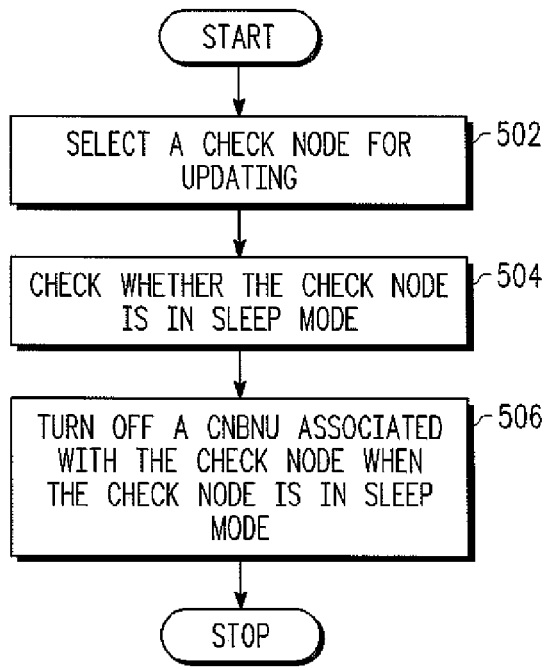
FIG. 5 is a flowchart depicting a method for reducing power consumption in an LDPC decoder, in accordance with the present invention.

FIG. 5 is a flowchart depicting a method for reducing power consumption in an LDPC decoder, in accordance with the present invention. At step 502, a check node is selected for updating. In an embodiment of the present invention, multiple check nodes in a layer are updated simultaneously. In another embodiment of the present invention, the selection of a check node is performed serially. In this embodiment, a check node is selected and updated, and the next check node is selected for updating, and so on, in each layer of the LDPC decoder. Therefore, a particular serial updating involves only a single check node update at a time.

Each bit of the one or more bit nodes corresponding to the check node has an associated bit node message value. Similarly, each bit at the check node has a check node message value associated with it. Updating a check node includes modifying the check node message value associated with the check node. Updating the check node also includes modifying the bit node message value at the bit nodes corresponding to the check node. At step 504, it is checked that whether the check node is in sleep mode. Further at step 506, a CNBNU associated with the check node is turned OFF when the check node is in sleep mode. In an embodiment of the present invention, accesses to the check node that is in sleep mode, as well as the corresponding one or more bit nodes, are also turned OFF.

Figure 6:
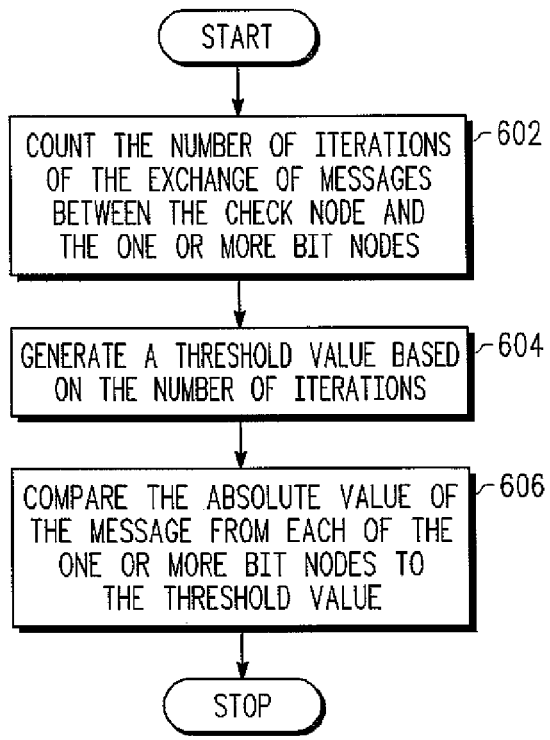
FIG. 6 is a flowchart depicting a method for checking whether a check node is in sleep mode, in accordance with the present invention.

FIG. 6 is a flowchart depicting a method for checking whether a check node is in sleep mode, in accordance with the present invention. At step 602, the number of iterations of the exchange of messages between the check node and the one or more bit nodes is counted. At step 604, a threshold value is generated, based on the number of iterations. In an embodiment of the present invention, a lower threshold value is selected with each subsequent iteration of the exchange of messages. In another embodiment of the present invention, a fixed threshold value is selected for each iteration of the exchange of messages. Further, at step 606, the absolute value of the bit node message of each of the one or more bit nodes corresponding to the check node is compared with the threshold value. The check node is considered to be in sleep mode when the absolute value of the message from each of the one or more bit nodes corresponding to the check node is greater than the threshold value.

Figure 7:
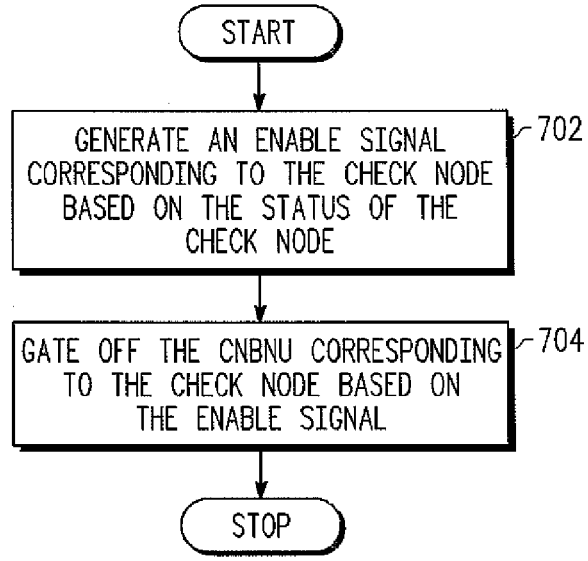
FIG. 7 is a flowchart depicting a method for turning OFF a Check Node and Bit Note Update Unit (CNENU) associated with a check node when the check node is in the sleep mode, in accordance with the present invention.

FIG. 7 is a flowchart depicting a method for turning OFF a Check Node and Bit Note Update Unit (CNBNU) associated with a check node when the check node is in sleep mode, in accordance with the present invention. At step 702, an enable signal is generated, which corresponds to the check node, based on the status of the check node. Further, at step 704, a CNBNU associated with the check node is turned OFF, based on the enable signal. In an embodiment of the present invention, the CNBNU is turned OFF when the enable signal is of a HIGH logic level. Turning OFF a CNBNU stops the exchange of messages between the check node and the corresponding one or more bit nodes.

While various embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

The invention claimed is:

1. A system for reducing power consumption in a Low Density Parity Check (LDPC) decoder, wherein the LDPC decoder comprises a plurality of Bit Node Memory Units (BNMUs) corresponding to a plurality of bit nodes, a plurality of Check Node Memory Units (CNMUs) corresponding to a plurality of check nodes, and a plurality of Check Node and Bit Node Update Units (CNBNUs), each BNMU having at least one bit node from the plurality of bit nodes for storing a bit node message value corresponding to one of the check nodes, each CNMU having at least one check node from the plurality of check nodes for storing check node message values corresponding to one or more bit nodes, each CNBNU associated with a check node and being used for updating the check node and one or more bit nodes corresponding to the check node in one or more iterations of an exchange of messages between the check node and the one or more bit nodes, the system comprising:
a sleep mode checking module that checks whether a check node is in a sleep mode, wherein the check node is in the sleep mode when an absolute value of the message going to each of the one or more bit nodes corresponding to the check node is greater than a threshold value; and
a gating circuit, connected to the sleep mode checking module, that turns OFF a CNBNU associated with the check node when the check node is in the sleep mode, wherein turning OFF the CNBNU stops the exchange of messages between the check node and the corresponding one or more bit nodes.

2. The system for reducing power consumption in the LDPC decoder of claim 1, wherein the sleep mode checking module comprises:
a comparator that compares the absolute value of the message from each of the one or more bit nodes to the threshold value.

3. The system for reducing power consumption in the LDPC decoder of claim 1, wherein the sleep mode checking module comprises:
a look-up table (LUT) that stores one or more threshold values;
an iteration counter that counts the number of iterations of exchange of messages between a check node and the corresponding one or more bit nodes;
a threshold select unit connected to the look-up table and the iteration counter, wherein the threshold select unit selects a threshold value from the one or more threshold values stored in the LUT based on the number of iterations of the exchange of messages; and
a comparator connected to the threshold select unit that compares the absolute value of the message going to each of the one or more bit nodes to the threshold value.

4. The system for reducing power consumption in the LDPC decoder of claim 1, wherein the absolute value of the message from each of the one or more bit nodes is a symbol probability.

5. The system for reducing power consumption in the LDPC decoder of claim 1, wherein the gating circuit comprises:
a memory that stores a status of each check node of the plurality of check nodes, wherein the status includes first information on whether each check node is in a sleep mode;
a controller connected to the memory, wherein the controller provides the status of a check node to the memory based on an input from the sleep mode checking module and generates an enable signal corresponding to the check node based on the status of the check node stored in the memory;

a control register connected to the controller, which stores second information about each check node, wherein the second information includes identification of one or more bit nodes corresponding to each check node; and a clock gating circuit connected to the controller, wherein the clock gating circuit turns OFF a CNBNU associated with the check node based on the enable signal when the check node is in the sleep mode.

6. A method for reducing power consumption in a Low Density Parity Check (LDPC) decoder, wherein the LDPC decoder comprises a plurality of Bit Node Memory Units (BNMUs) corresponding to a plurality of bit nodes, a plurality of Check Node Memory Units (CNMUs) corresponding to a plurality of check nodes, and a plurality of Check Node and Bit Node Update Units (CNBNUs), each BNMU having at least one bit node from the plurality of bit nodes, wherein each of the at least one bit nodes is used for storing a bit node message value corresponding to one of the check nodes, each CNMU having at least one check node from the plurality of check nodes, wherein each of the at least one check nodes is used for storing check node message values corresponding to one or more of the bit nodes, each CNBNU associated with a check node and being used for updating the check node and one or more bit nodes corresponding to the check node in one or more iterations of an exchange of messages between the check node and the one or more bit nodes, the method comprising the steps of:

selecting a check node for updating, wherein updating the check node comprises modifying the check node message value corresponding to the check node and the bit node message value corresponding to each of the one or more bit nodes corresponding to the check node;

checking whether the check node is in a sleep mode, wherein the check node is in the sleep mode when an absolute value of the message going to each of the one or more bit nodes corresponding to the check node is greater than a threshold value; and turning OFF a CNBNU associated with the check node when the check node is in the sleep mode, wherein turning OFF the CNBNU stops the exchange of messages between the check node and the corresponding one or more bit nodes.

7. The method for reducing power consumption in a LDPC decoder of claim 6, wherein the step of selecting a check node for updating is performed iteratively for each of the plurality of check nodes.

8. The method for reducing power consumption in a LDPC decoder of claim 6, wherein the absolute value of the message from going to each of the one or more bit nodes is a symbol probability.

9. The method for reducing power consumption in a LDPC decoder of claim 6, wherein the step of checking whether the check node is in the sleep mode comprises the steps of:

counting the number of iterations of the exchange of messages between the check node and the one or more bit nodes;

selecting a threshold value from one or more predetermined threshold values based on the number of iterations; and comparing the absolute value of the message going to each of the one or more bit nodes to the selected threshold value.

10. The method for reducing power consumption in a LDPC decoder of claim 9, further comprising the step of:

storing a status of the check node, wherein the status includes information on whether the check node is in the sleep mode.

11. The method for reducing power consumption in a LDPC decoder of claim 6, wherein the step of turning OFF a CNBNU associated with the check node comprises the steps of:

generating an enable signal corresponding to the check node based on the status of the check node; and turning OFF the CNBNU associated with the check node based on the enable signal.

12. A Low Density Parity Check (LDPC) decoder, comprising:

a plurality of Bit Node Memory Units (BNMUs) corresponding to a plurality of bit nodes, each BNMU having at least one bit node from the plurality of bit nodes;

a plurality of Check Node Memory Units (CNMUs) corresponding to a plurality of check nodes, each CNMU having at least one check node from the plurality of check nodes, wherein each of the at least one check nodes stores a check node message value corresponding to one or more of the bit nodes, and wherein each of the at least one bit nodes stores a bit node message value corresponding to a check node;

a plurality of Check Node and Bit Node Update Units (CNBNUs), wherein each CNBNU updates a check node and one or more of the bit nodes corresponding to said check node in one or more iterations of an exchange of messages between check node and the one or more bit nodes;

a sleep mode checking module that checks whether a check node is in a sleep mode, wherein the check node is in the sleep mode when an absolute value of a message going to each of one or more bit nodes corresponding to the check node is greater than a threshold value; and a gating circuit that gates turns OFF a CNBNU associated with the check node when the check node is in the sleep mode, wherein turning OFF the CNBNU stops the exchange of messages between the check node and the one or more bit nodes.

13. The LDPC decoder of claim 12, wherein the sleep mode checking module comprises:

a comparator that compares the absolute value of the message from each of the one or more bit nodes to the threshold value.

14. The LDPC decoder of claim 12, wherein the sleep mode checking module comprises:

a look-up table (LUT) that stores one or more threshold values;

an iteration counter that counts the number of iterations of the exchange of messages between a check node and the corresponding one or more bit nodes;

a threshold select unit connected to the look-up table and the iteration counter, wherein the threshold select unit selects a threshold value from the one or more threshold values stored in the LUT based on the number of iterations of the exchange of messages; and a comparator connected to the threshold select unit that compares the absolute value of the parameter of each of the one or more bit nodes to the threshold value.

15. The LDPC decoder of claim 12, wherein the message from each of the one or more bit nodes is a symbol probability.

16. The LDPC decoder of claim 12, wherein the gating circuit comprises:

a memory that stores a status of each check node of the plurality of check nodes, wherein the status includes first information on whether the check node is in a sleep mode;

a controller, connected to the memory, wherein the controller provides the status of a check node to the memory based on an input from the sleep mode checking module and generates an enable signal corresponding to the check node based on the status of the check node stored in the memory;

a control register, connected to the controller, wherein the control register stores second information about each check node, wherein the second information includes identification of one or more bit nodes exchanging messages with the check node; and a clock gating circuit, connected to the controller, which turns OFF a CNBNU associated with the check node based on the enable signal when the check node is in the sleep mode.

17. The LDPC decoder of claim 16, wherein the enable signal is generated when the check node is in the sleep mode.

* * * * *